United States Patent [19]

Jonca

[11] Patent Number: 4,701,007
[45] Date of Patent: Oct. 20, 1987

[54] SYSTEM FOR THE PRODUCTION OF ELECTRICAL WIRING PARTS

[75] Inventor: Henri V. J. Jonca, Toulouse, France

[73] Assignee: Societe Nationale Industrielle Aerospatiale, Paris, France

[21] Appl. No.: 896,277

[22] Filed: Aug. 14, 1986

Related U.S. Application Data

[63] Continuation of Ser. No. 599,569, Apr. 12, 1984, abandoned.

[30] Foreign Application Priority Data

Apr. 23, 1983 [FR] France .................. 83 06903

[51] Int. Cl.⁴ .............................................. G02B 6/04
[52] U.S. Cl. ............................. 350/96.10; 350/96.24; 364/468; 364/478; 439/490
[58] Field of Search ............... 350/96.10, 96.15, 96.24; 254/134.3 R; 339/28, 113 R, 113 B, 113 L, 147 R, 148, 278 R; 364/468, 478; 369/53, 69, 70

[56] References Cited

U.S. PATENT DOCUMENTS

| | | | |
|---|---|---|---|
| 3,760,169 | 9/1973 | Paculat | 364/468 |
| 3,970,354 | 7/1976 | Hopkins et al. | 339/113 R |
| 4,468,612 | 8/1984 | Starr | 339/113 B X |

FOREIGN PATENT DOCUMENTS

2118545 10/1971 Fed. Rep. of Germany ... 339/113 L

OTHER PUBLICATIONS

Corry, "A Microprocessor-Based Controller for a Semi-Automatic Wirewrap Machine," *Proc. of the IREE Aust.*, vol. 41, No. 1, Mar. 1980, pp. 22-25.

*Primary Examiner*—John Lee
*Attorney, Agent, or Firm*—Fisher, Christen & Sabol

[57] ABSTRACT

A system for producing electrical wiring parts in which every conductor connects two connection devices, each connecting point of at least one of which is transparent, and which comprises a computer associated to a bulk memory storing itmes of information relative to the identification of the conductor and to the addresses of its ends. The system comprises at least one work station for an operator, which work station is connected with the computer and bulk memory, and comprises data input means and an assembly of selectively controllable light points disposed correspondingly to the transparent connection points of the connection device.

7 Claims, 8 Drawing Figures

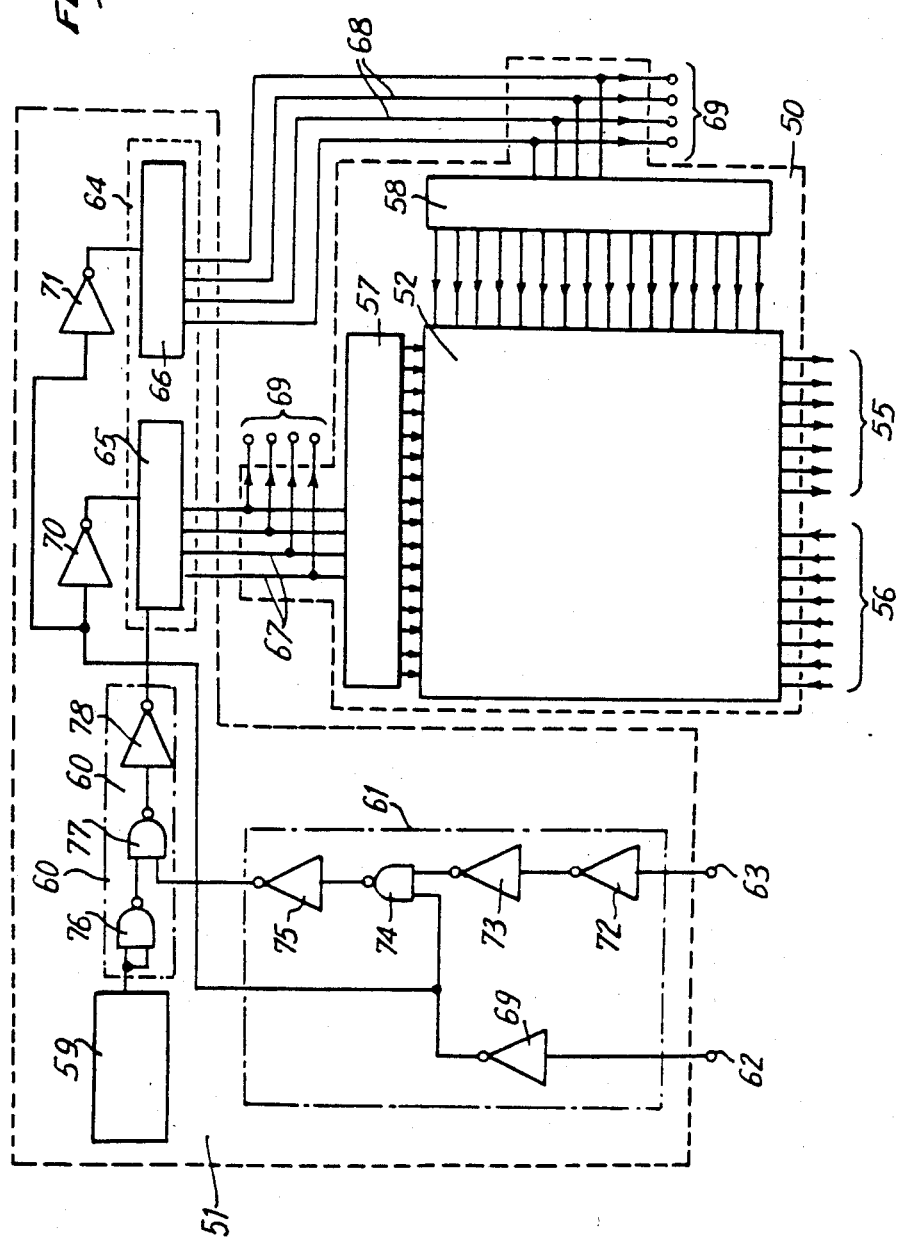

SYSTEM FOR THE PRODUCTION OF ELECTRICAL WIRING PARTS

This is a continuation of application Ser. No. 599,569, filed on Apr. 12, 1984, now abandoned.

The present invention relates to a system for producing wiring parts, in order to assist connection and guiding through of each electrical conductor of said parts.

It is known that the complete wiring of an electrical installation, such as for example electric installation and wiring of an aircraft, is subdivided into a plurality of wiring parts, produced separately and then joined one to the other. Each conductor or cable inside each wiring part is identified by a code; and each of the two ends of a conductor is identified by an address which corresponds to its position of connection inside the connection device (connector or equipment) to which said end has to be connected, and the guiding through of the conductor inside said wiring part, between the two ends thereof, is the subject of coded indications.

These different address and guiding through indications, concerning the different conductors of the different wiring parts, are worked out and processed when the wiring is designed, and generally, in the case of a complex installation, they are stored in bulk memories, such as supple discs or hard discs, adapted to be linked with an electronic computer. A computer can therefore issue, as required, paper materials on which are printed the items of information relative to said wiring parts. Up to now, however, processing of the printed data furnished by the computer has been done manually by the operators, so that there is always a risk of errors occurring which can only be detected by testing, when wiring is completed. The consequence being lengthy, fastidious and expensive operations for detecting errors of wiring and correcting them. In addition, manual processing requires great quantities of paper materials from the computer, which can only contribute to increasing the risks of errors and the inconvenience.

It is the object of the present invention to overcome these drawbacks by proposing a system capable, on the one hand, of picking up, on the bulk memories containing the data relative to the wiring parts, data relative to the connection and guiding through of the conductors, and of presenting said data in a form which is directly processable by the operator, and on the other hand, of controlling the connection operation and signalling to the operator any wrong connection or omission. This feature is particularly important in that it enables to finish the part at the right moment and thus to prevent any complex alterations after the final test.

The invention proposes, to this end, a system for producing electrical wiring parts in which every conductor connects two connection devices of which each connecting point of at least one of them is transparent, and which comprises a computer associated to a bulk memory storing data relative to the identification of the conductor and the addresses of its ends. The system according to the invention is remarkable in that it comprises at least one working station for an operator, which station is linked to said computer and bulk memory, and in that said working station comprises data input means, and an assembly of selectively controllable light points arranged correspondingly to said transparent connecting points of said connection device. The data input means may be any type, such as for example an alphanumeric keyboard or optical readers: their object is to enter into the system the codes of a connector to be connected and of the connection device with transparent connecting points.

Thus, when a computer knows the codes of a cable to be connected and of the connection device, via the data input means, said computer can cause the controllable corresponding lightpoint to light up. Then if the connection device is applied against the said assembly of controllable light points, the address of the conductor to be connected is then revealed by the appearance of a light.

The system according to the invention therefore enables the physical locating (in the form of a lit-up address) without the operator having to search for the locations on the connection device to be connected, before inserting the end of the conductor to be connected for example. Thus it is clear that errors and connection times are reduced, and the system according to the invention, as a result, minimizes the costs of producing a wiring part and the time required for such production.

In order for the address lighting to be performed simply, the connecting points of the connection device should be transparent, in other words, they should readily allow the light through. This is particularly the case when the connection device comprises a base provided with a through hole in each connection point, the connection between said connection device and a conductor being achieved by plugging a socket into such holes, which socket is already crimped on the end of said conductor.

Connection devices of this type come in many different shapes and sizes. Therefore, in order to avoid having to alter the connections and the controls between the computer and the assembly of controllable light points in relation to the connection device to be connected, it is advantageous, whatever the type of the connection device, for the system according to the invention to comprise a fixed matrix of controllable light points and a bundle of optical fibers which, by one of their ends, are facing at least some of said controllable light points and, by their other end, are facing the said transparent connection points of the said connection device.

Such a bundle of optical fibers thus acts as a specific interface between the fixed matrix and the connection device. In this case, as many interface bundles of optical fibers are provided as there are types of connection devices to be connected and each of such bundles is mounted inside a removable member, to make it readily interchangeable with the others.

Advantageously, in order to adequately shape each conductor inside the wiring part to which it belongs, namely in order to guide it through, each working station is provided with display means, and the data input means, the assembly of controllable light points, the connection device to be connected and the said display means are integral with a movable member, such as a carriage, which is movable along at least one rack provided with notches for the conductors of the wiring part and supported by the framework of said work station.

Thus the computer indicates the progress of each conductor, so that the operator, by moving the said movable member, by selecting the rack and the notch in the rack in which to introduce the cable, can arrange for each conductor to have the length necessary to cover the required path, and can pre-shape the part of the wiring part which is close to said connection member to correspond to the said path.

Preferably, the movable member is a slidable unit fittable into said movable member and removable therefrom, by simple sliding for example.

Advantageously, in order to find out rapidly the address of the yet unconnected end of a conductor whose other end has been connected with a connection device, each work station further comprises at least one other connection member which, on the one hand, is adapted to be joined with a connection device to which are already connected the ends of a number of conductors, and, on the other hand, is joined to a detection device adapted to indicate to the computer which one of said conductors whose end opposite said connection device, the operator is touching. The computer can thus display directly on the work station display means, the address of the conductor end touched by the operator. In order to take into account all the different types of connection devices, a plurality of bundles of aids are provided, which are adapted to be interposed between said connection device of a wiring part and the connection member.

Thereagain, each bundle of aids acts as a specific interface between a connection device and the connection member.

According to one advantageous embodiment of the invention, said detection device comprises a matrix of controllable points which can at least take two different electrical states, each point being linked to a conductor, means of scanning the state of said controllable points of the matrix and means of controlling said scanning means.

The matrix may be of the type with optical couplers, whereas the scanning device may comprise an astable multivibrator.

The system according to the invention therefore introduces a new method of wiring electrical assemblies by adjusting itself to the computer control of their preparation and using sophisticated techniques such as optical reading or sensitive touch.

From a data base existing on the bulk memories and with the appropriate computer program, the operator has access to the wiring part which he wants to produce and he can have all the elements of the part which he wants to connect or to guide through, transferred into his work area. Once said transfer is completed, a signal is issued (ringing signal, light signal, ...) to warn the operator that his work station is ready. From that moment, he has access to the connection or guiding through data from different possibilities:

(a) If the conductor is located but not yet connected on an element (such as a socket connector, or connecting strip), the operator enters the location of said connector by using the alphanumeric keyboard, and the computer responds by lighting up the terminal to be connected, by means of the signal light matrix and the optical fibers.

It is understood that, as pointed out hereinabove, the information can be entered, if not by means of the alphanumeric keyboard, then by means of optical readers (code bar, printed matrix, ...). The conductor being then connected by one of its ends, the operator can, if he so wishes, find out the destination of the other end from a message displayed in uncoded form (alphanumeric display), by working the keyboard.

(b) If the conductor is already connected to one element, the operator can, by using the system of sensitive touches and by electrically connecting the end already connected to the work station, find out the destination of the other end of each cable. This location possibility is much more rapid than the corresponding one described under (a).

(c) If the conductor is neither connected, nor located, the operator can, by using a pre-programmed sequence, connect and guide through a series of cables to be mounted on the wiring part, by way of a cable storing magazine (or organ) which is known and identifiable by the system. To this end, each work station is further equipped with a magazine divided into a plurality of compartments, each one being identifiable by the computer and containing an unidentified conductor.

(d) The operator can also, just by working the alphanumeric keyboard, obtain all kinds of information relative to the part which he is working on.

The system according to the invention is therefore characterized by an assembly of work stations on which are mounted the different data recording and reproducing members. Said stations may be connected via parallel connection systems or via synchronous or asynchronous loops, with the central computer controlling the bulk memories and associated control interfaces.

Each work station may be equipped with microprocessors and as such be autonomous with respect to the central system. The design of the device and the disposition of its constituting elements are functions of the work requirements.

(e) It is to be noted that the system according to the invention can work in semi-automatic manner, whereby the operator introduces the number of a terminal by means of the keyboard; but preferably, it will be used automatically, the central computer controlling entirely the machine.

The invention will be more readily understood on reading the following description with reference to the accompanying drawings, in which.

Figure 6:
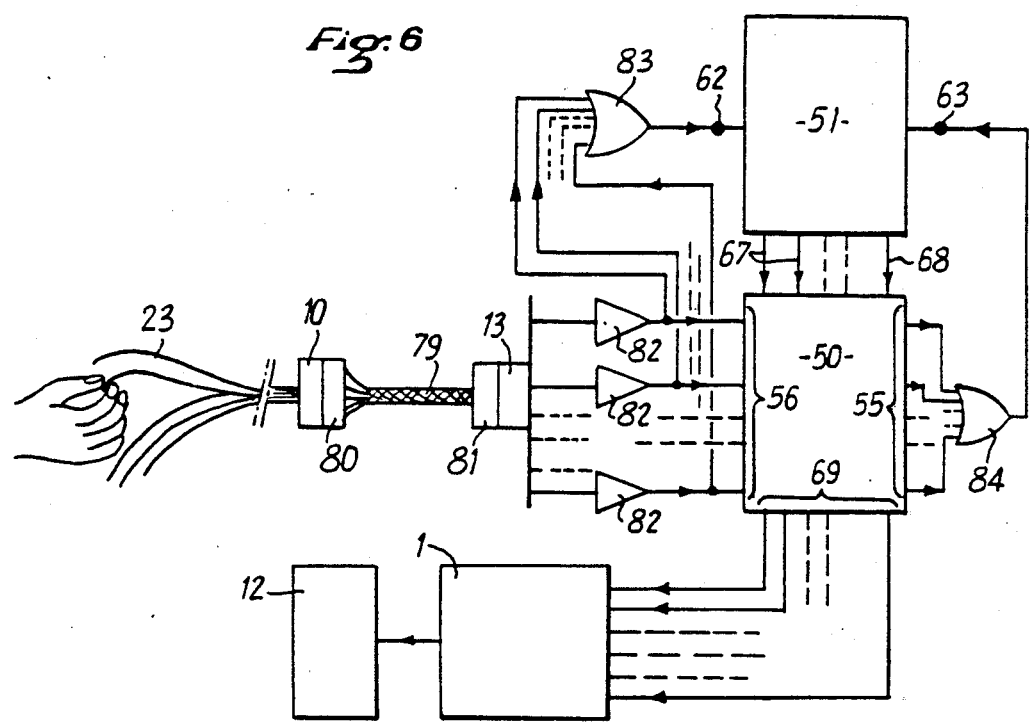

FIG. 6 diagrammatically illustrates the address recognition device for the unconnected end of a cable whose other end is already connected.

FIG. 7 gives a block diagram of part of the device shown in FIG. 6.

Figure 8:
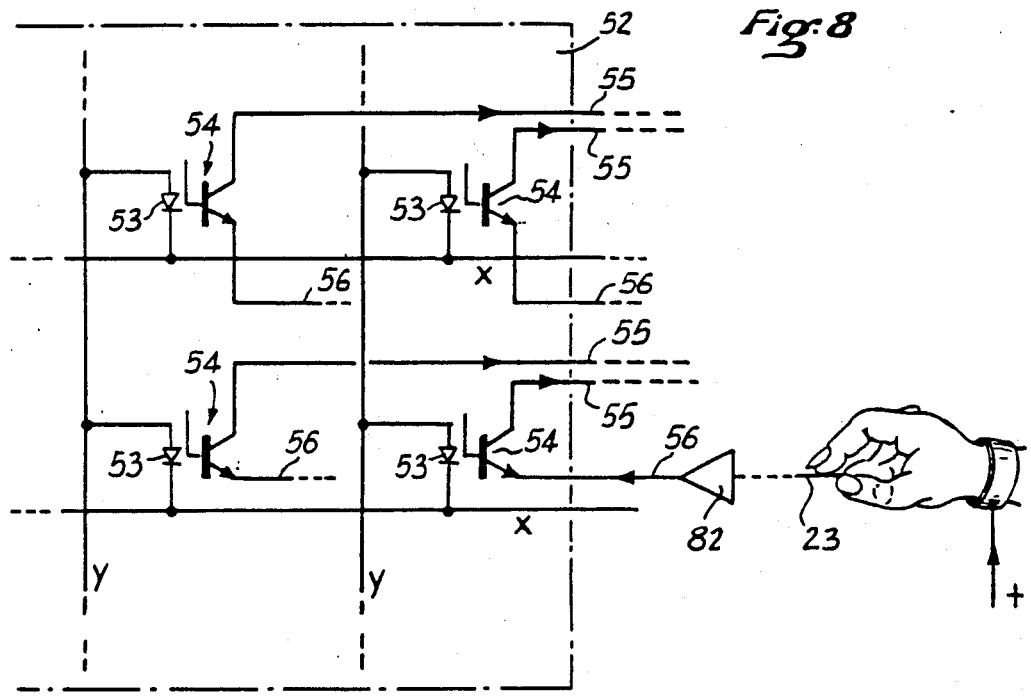

FIG. 8 illustrates how the matrix of optoelectronic couplers works.

Figure 1:
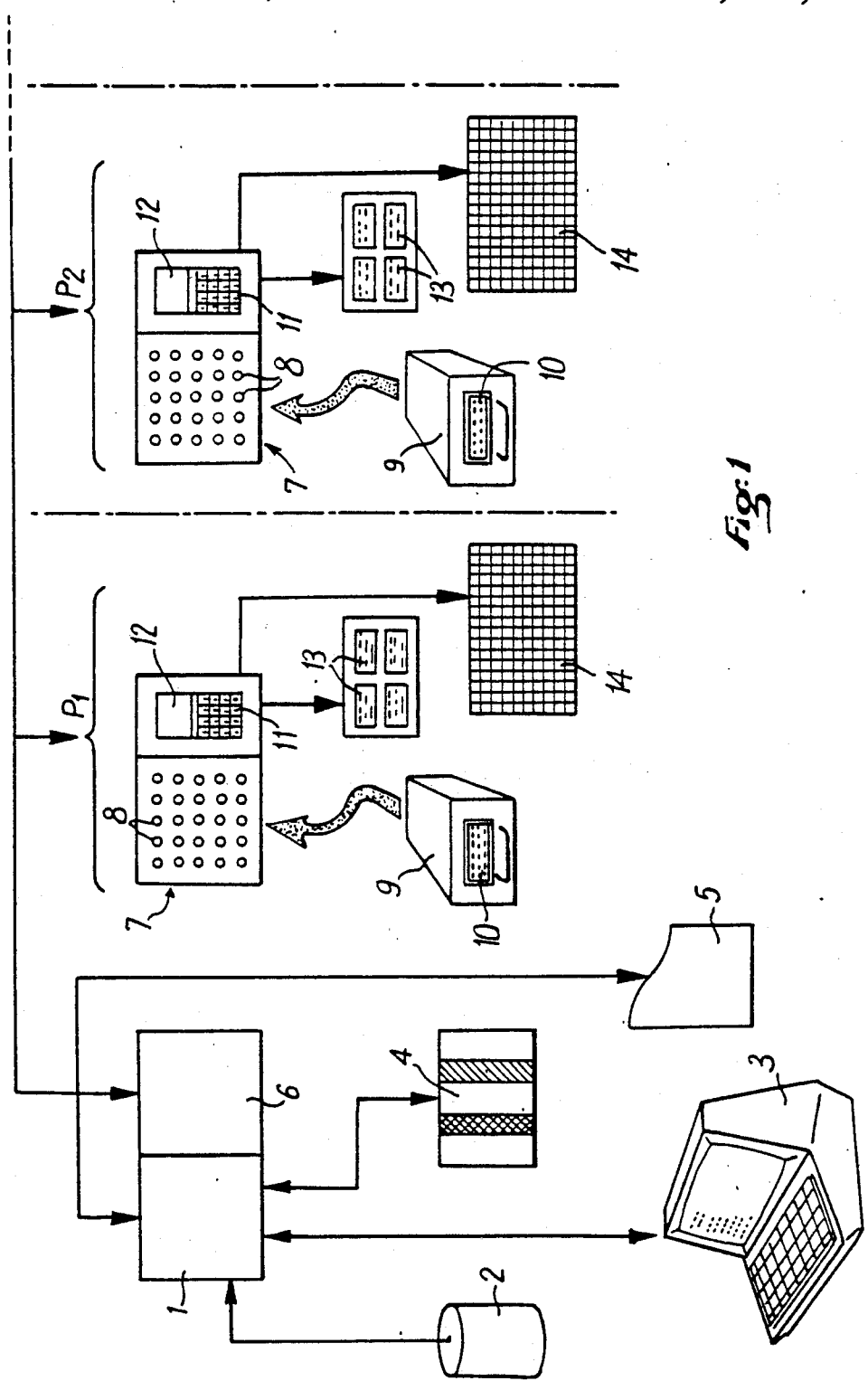
FIG. 1 is a block diagram of the wiring system according to the invention.

According to FIG. 1, the system for producing wiring parts according to the invention comprises a central computer 1, linked with:

a mass storage disc 2, acting as bulk memory, in which are stored the working information (or data) and the operator's programs;

a display console 3 for initiating the programs and storing the data into the bulk memory 2;

a supple disc reader 4 which can be used as a bulk memory in certain cases, and as a means of transfer of data towards the hard disc of the memory 2;

a high speed printer 5 permitting to produce an operator's log;

a specialized interface device 6 permitting the connection of different work stations $P_1, P_2, \ldots P_i \ldots$ with the computer 1 and towards the different work stations attributed to said central computer.

Each work station $P_i$, connected via the specialized interface device 6 to the central computer 1, comprises:

a matrix 7 of light indicators 8, each of which indicators can be switched on and off independently of the others upon control of computer 1;

a movable member 9 such as a sliding unit, carrying a connection element 10 to be connected with conductors 23 and which is specific to element 10, said sliding unit acting as a specialized interface between the matrix 7 of light indicators 8 and said element 10, as described hereinafter;

an alphanumeric keyboard 11 for entering the different references identifying the elements to be connected (cables, plug connectors, connector strips, etc.) and setting up an operating dialogue with the computer 1;

an alphanumeric display system 12 enabling the computer 1 to notify the operator of different operations and in particular to inform him in uncoded form of the different destinations of the elements to be connected;

a set of connectors 13 adapted to achieve electrical connection between a wiring part and the computer via the work station, and permitting to process the elements by a simple light touch on the free end of the cable (sensitive touch), in the manner described hereinafter;

and, optionally, a cable storing magazine 14 for the non-located cables.

Figure 2:
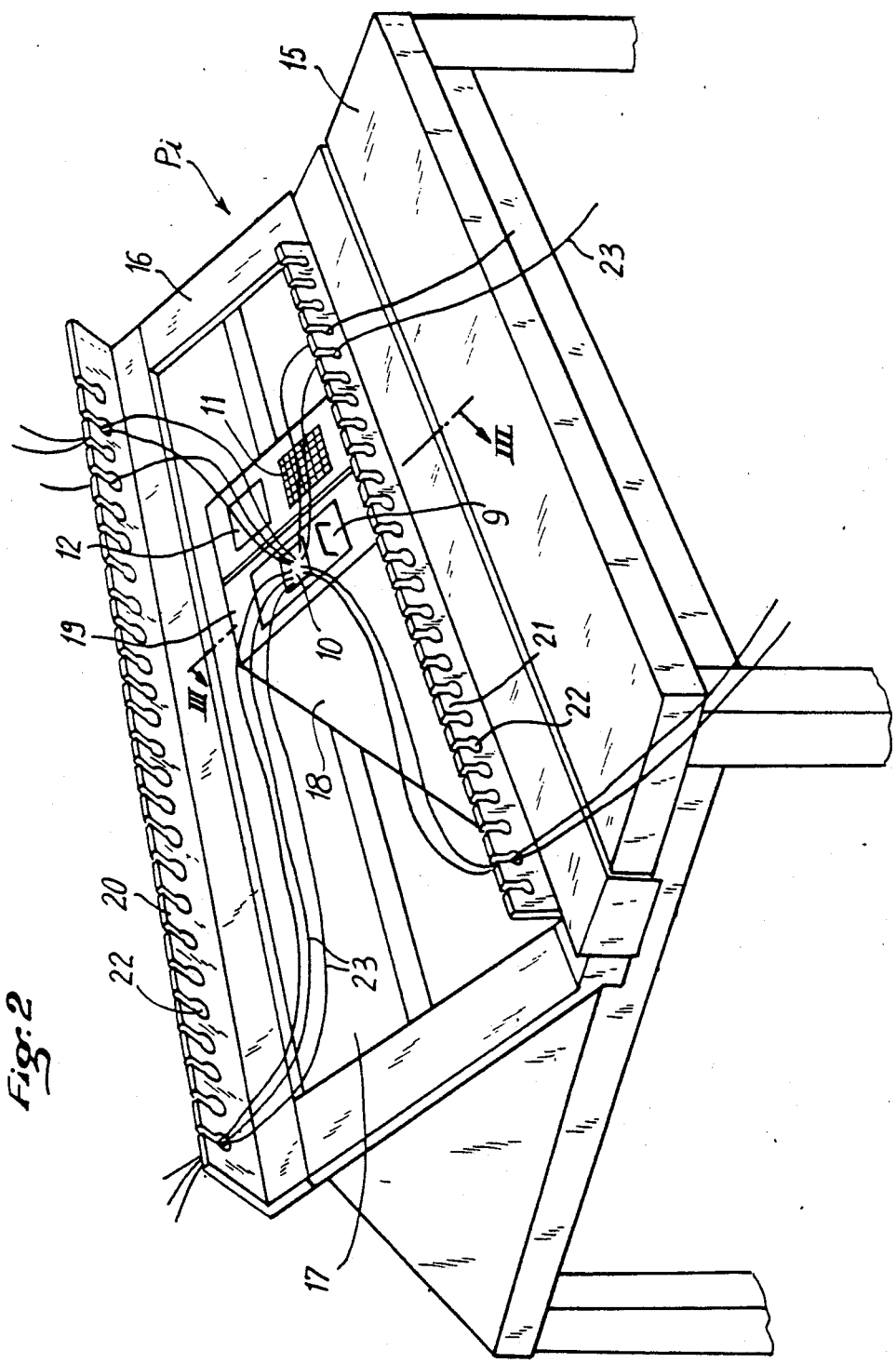
FIG. 2 is a perspective view of one embodiment of the work station for the system shown in FIG. 1.

As illustrated in FIG. 2, every work station $P_i$ comprises a frame 15, of the table type for example, where the operator can be placed. Said frame 15 supports a console 16, with a wide opening 17, giving access to a carriage 18 which is cubicle-shaped and can slide, by means not shown, from one side of the frame 15 to the other. Said carriage 18 is inclined in such a way that its front face 19 presents itself in the best possible way to the operator. Said face 19 of the carriage 18 carries the alphanumeric keyboard 11 and the display system 12. Above and beneath the longitudinal edges of opening 17 are fixed racks 20 and 21 integral with the frame 15 and provided with notches 22 into which can be engaged the cables 23 to be connected.

Figure 3:
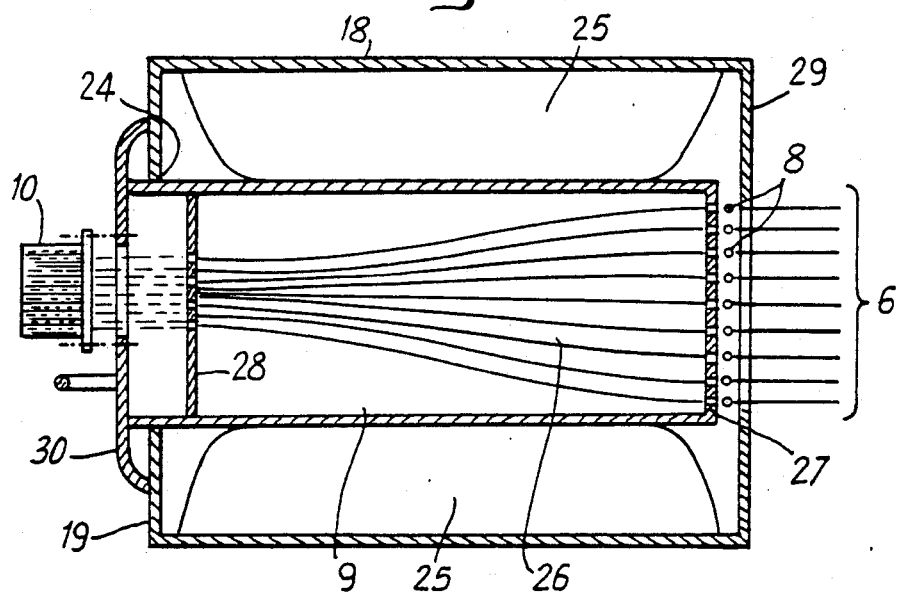
FIG. 3 is a cross-section along line III—III of FIG. 2, illustrating diagrammatically the structure of a sliding member and of its receptacle-carriage.

Moreover, an opening 24 (FIG. 3 also refers) is provided in the front face 19 of carriage 18, for introducing the sliding unit 9. Guiding and sliding members 25 enable the sliding in and out of the sliding unit 9 with respect to carriage 18. Inside unit 9 is mounted a bundle 26 of optical fibers which extend from the bottom 27 of said sliding unit, where they spread correspondingly to the light indicators 8 of the matrix 7, towards a front wall 28, where they spread correspondingly to the recesses provided for receiving the pins of a connector plug 10. The light indicators 8 of the matrix 7 are fixed on the bottom of carriage 18 and, when sliding unit 9 is fitted in said carriage, namely when front face 30 of said unit 9 rests against front face 19 of said carriage 18, the end of each optical fiber from the bundle 26 is found to be facing a light indicator 8 of the matrix 7, on the side of bottom 27. Also, when a connector plug or any other element 10 to be connected is fixed (in any way required) on front face 30 of sliding unit 9, the end of each optical fiber from the bundle 26 is found, on the side of front wall 28, to be facing a housing for the pin of said connector plug or element 10. Said bundle 26 of unit 9 thus creates a light connection between the light indicators 8 and the housings for the elements to be connected 10. Thus, the matrix 7 of light indicators 8 controlled by central computer 1 via interface device 6 can be fixed and identical for all the elements 10. On the contrary, a sliding unit 9 is associated to every type of element 10, meaning that the distribution of the ends of optical fibers 26 at the level of wall 28 is specific to one element 10 to be connected. The operator selects the sliding unit 9 as a function of the type of element 10 to be wired.

Figure 4:
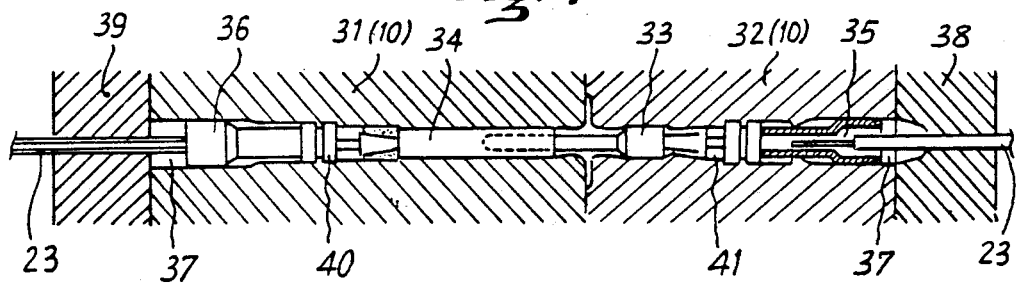
FIG. 4 is a longitudinal section through a plug connector to be connected.

FIG. 4 illustrates diagrammatically a partial cross-section of a connector of a known type equipped with pins and sockets and of which each one of the two parts 31 and 32 (which parts can each be considered as an element 10) can be wired by the installation according to the invention.

Each pin 33 or socket 34 of the connector is crimped on the end of a bared cable 23 via an adaptor sleeve 35 or 36 and said pins and sockets are fitted into housings 37 provided in the bodies of the male part 32 and of the female part 31 of the complete connector.

Tight zones 38 and 39 may complete the connector, and a connector pin locking system 40 or 41 may be provided to lock each connector pin in position and thus prevent its accidental removal.

Whatever the case, before wiring, the housings 37 of female part 31 and of male part 32 are empty, and the operator is able to see the front end of the optical fibers 26 through said housings.

Figure 5:
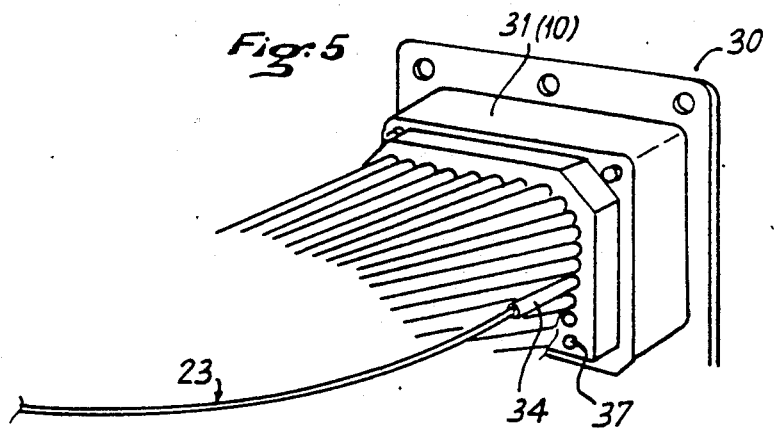
FIG. 5 is a perspective view from the front of a plug connector being wired.

When the operator is required to produce a wiring part comprising connector plug 10 (such as for example one of those illustrated in FIG. 4 under reference numbers 31 and 32), he begins by selecting the appropriate sliding unit 9, and he fixes connector plug 10, on the front face 30 of said unit 9, in the spot reserved to this effect. Then he introduces unit 9 into carriage 18 of work station $P_i$. With the alphanumeric keyboard 11 of work station $P_i$, the operator can have access to the data concerning the wiring part which he has to produce and which are stored in bulk memory 2. He then records the codes of the connector plug or strip 10 and of a cable 23 which he has to connect. In response, the central computer 1 switches on the corresponding light indicator 8, so that the operator can see a light inside the corresponding housing 37. The operator places the corresponding pin 33 or 34 on the bared end of cable 23 (see FIG. 5) and introduces same into the lit housing 37.

In addition, the central computer 1 displays on device 10 the path to be followed by the cable 23 in question, so that the operator can introduce said cable into the corresponding notch 22 of the rack 20 or 21.

It is therefore possible for the operator following the indications given by the central computer 1, to correctly connect all the cables 23 converging on element 10 and to start guiding said cables through from said element 10.

When the operator is required to connect the unconnected end of a cable 23 whose other end is already connected to said element 10, he can repeat the process indicated hereinabove. But the invention provides another quicker method, using sensitive touch, as illustrated in FIGS. 6, 7 and 8.

To carry out said method, a position coder is provided, which coder is constituted, on the one hand, of a matrix system 50 and, on the other hand, of a system 51 for controlling said matrix system.

The matrix system 50 comprises a matrix 52 of conductors disposed according to lines X and columns Y (see FIG. 8) and at each point of intersection of a line X with a column Y, is connected a diode 53 controlling optical couplers 54. The collectors of said optical couplers 54 are connected to output terminals 55 of said matrix 52, whereas the transmitters of said optical couplers 54 form input terminals 56 for said matrix. The matrix system 50 further comprises two decoders 57 and 58 which control respectively columns Y and lines X of matrix 52.

The control system 51 comprises an astable multivibrator 59 whose pulse train may be locked by a locking system 60, which locking system is controlled by a control 61 with two inputs 62 and 63. Control system 51 further comprises a counting device 64, composed of two counters 65 and 66, actuating respectively decoders 57 and 58 of the matrix system 50, owing to connections 67 and 68, which also form outputs 69 for said matrix system 50, outputs connected to computer 1. Locking system 60 and control 61 comprise an assembly of logic gates 69 and 72 to 78 associated to two gates 70 and 71 controlling counters 65 and 66.

As illustrated in FIG. 6, outputs 55 of the matrix system 50 are connected to input 63 of control system 51, via an OR gate 84.

Moreover, the bared end of a conductor 23, which is liable to be touched by the operator's hand (optionally connected to a point of predetermined potential by a wrist-band—see FIG. 8) is connected with an input 56 of matrix system 50, via element 10, and via an interface bundle of aids 79 with end connectors 80 and 81, and a connector 13 and amplifier 82. In addition, the outputs of amplifiers 82 are connected by an OR gate 83 to the input 62 of control system 51.

The device illustrated in FIGS. 6 to 8 works as follows.

As soon as power is applied, multivibrator 59 starts operating.

However, in the rest position, the input 63 is at logic level 1, so that the corresponding input of NAND gate 74 is validated by the action of the two STEP gates 72 and 73. Also, in the rest position, input 62 is at logic level 1, so that because of STEP gate 69, the other input of NAND gate 74 is invalidated. NAND gate 77 is therefore likewise invalidated and the signal of multivibrator 59 is locked.

When the operator touches the end of a conductor 23 not connected to element 10, he applies a logic level 0 first on input 62, and second on the corresponding output 55 of matrix 52.

Said logic level 0 applied to input 62 has the effect of resetting and validating sensors 64 and 65 via gates 70 and 71. Also, owing to gate 69, a level 1 is applied to the corresponding input of NAND gate 74.

As a result, and supposing that input 63 always receives a logic level 1, the output signal of NOT-AND gate 74 validates NAND gate 77 and the signal of multivibrator 59 is released and reaches to counters 65 and 66. Said counter then starts working and permits a step-by-step scanning of the electrical state of every point of the matrix 52. As long as, during said scanning the points of the matrix 52 which are examined are points which are not electrically connected to the operator's hand, the corresponding output 55 addresses to the input 63, a logic level 1 via OR gate 84. Thereafter, the counters 65 and 66 continue to operate, moving from one point of the matrix to the next.

On the contrary, when, during their scanning operation, counters 65 and 66 reach the point of matrix 52 which is electrically connected to the operator's hand, a new logic level 0 appears at the corresponding output 55 and as a result at input 63. NAND gate 74 then locks, and the same applies to NAND gate 77. Counters 65 and 66 no longer receive the pulses from astable multivibrator 59.

Computer 1 thus knows, from outputs 69, the address of the point of the matrix 52 at which counter 65 and 66 stop operating, meaning that said computer identifies the conductor 23 touched by the operator. And it can then indicate to the latter, through display means 12, the destination of the non-connected end of said conductor 23.

What is claimed is:

1. A system for producing a wiring part consisting of conductors having ends and of at least a connection device having transparent connecting points for said ends, said transparent connecting points having a preselected distribution in relation to each other, said conductors inside said wiring part being identified by conductor codes, the ends of said conductors being identified by end addresses which correspond to said connecting points of said connection device, and each of said conductors having inside said wiring part a path identified by a guiding through code, said system comprising:
    (a) a computer associated with a bulk memory in which are stored said conductor codes, said end addresses and said guiding through codes; and
    (b) at least a work station for an operator, connected to said computer and to said bulk memory, said work station comprising:
        (i) a frame;
        (ii) a rack supported by said frame and provided with notches to receive said conductors;
        (iii) a movable member displaceable along said rack;
        (iv) data input means;
        (v) an assembly of selectively controlled light points arranged according to a distribution similar to that of said transparent connecting points of said connection device; and
        (vi) display means,
        said data input means, said assembly of light points, said connection device and said display means being fixed to said movable member.

2. The system of claim 1 wherein said assembly of controlled light points comprises a single matrix of light points and a plurality of interchangeable bundles of optical fibers, each of said bundles interfacing with the connection device and being constituted of optical fibers, which, at one of their ends, are in registration with at least some of said controlled light points and, at their other end, are in registeration with the transparent connecting points of said connection device, wherein each of said bundles is mounted on an interchangeable sliding unit which can be put in place into said movable member and removed therefrom by sliding.

3. The system of claim 1 wherein each work station comprises at least one connection member which, on the one hand, can be connected with a connection device, which is connected to the ends of codductors, and, on the other hand, is connected with a detection device, said detection device being adapted so that an operator can touch at least one of the conductors at the end of the detection device opposite of said connection device, and said detection device indicating to the computer which of said conductors of the wiring part is being touched by the operator at the end of the detection device opposite of said connection device.

4. The system as claimed in claim 3 wherein there is a plurality of bundles of interface aids interposed between said connection device of said wiring part and said connection member.

5. The system as claimed in claim 3 wherein said detection device comprises a matrix of controllable points capable of taking at least two different electrical states, each point being connected with a conductor, means for scanning the state of said controllable points of said matrix, and means for controlling said scanning means.

6. The system as claimed in claim 5 wherein said matrix of controllable points has optical couplers and the scanning means comprises an astable multivibrator.

7. The system as claimed in claim 1 wherein every work station further comprises a magazine divided into a plurality of compartments, each compartment being identifiable by the computer and containing a non-identified conductor.

* * * * *